United States Patent
Lin et al.

(10) Patent No.: US 8,405,168 B2
(45) Date of Patent: Mar. 26, 2013

(54) NANOWIRE FABRICATION METHOD AND SEMICONDUCTOR ELEMENT USING NANOWIRE FABRICATED THEREBY

(75) Inventors: Chia-Yi Lin, Hsinchu (TW); Min-Cheng Chen, Hsinchu (TW); Hou-Yu Chen, Hsinchu (TW)

(73) Assignee: National Applied Research Laboratories, Taipei (TW)

( * ) Notice: Subject to any disclaimer, the term of this patent is extended or adjusted under 35 U.S.C. 154(b) by 207 days.

(21) Appl. No.: 13/017,777

(22) Filed: Jan. 31, 2011

(65) Prior Publication Data

US 2012/0146161 A1    Jun. 14, 2012

(30) Foreign Application Priority Data

Dec. 10, 2010 (TW) .............................. 99143262 A (51) Int. Cl.
    *H01L 29/78* (2006.01)
(52) U.S. Cl. ................ 257/412; 257/E29.242; 977/762; 977/938
(58) Field of Classification Search .................. 977/762, 977/938
    See application file for complete search history.

(56) References Cited

U.S. PATENT DOCUMENTS

2009/0065852 A1* 3/2009 Lin et al. ................ 257/326

OTHER PUBLICATIONS

Lin et al. "A Novel Multiple-Gate Polycrystalline Silicon Nanowire Transistor Featuring an Inverse-T Gate." IEEE Electron Device Letters, vol. 29, No. 7, Jul. 2008.*
Hsiao, Cheng-Yun et al., "Novel poly-silicon nanowire field effect transistor for biosensing application", Biosensors and Bioelectronics 24, Jul. 26, 2008, pp. 1223-1229.

* cited by examiner

*Primary Examiner* — Wensing Kuo
(74) *Attorney, Agent, or Firm* — Muncy, Geissler, Olds & Lowe, PLLC (57) ABSTRACT

The present invention discloses a nanowire fabrication method and a semiconductor element using a nanowire fabricated thereby. The method of the present invention comprises steps: providing a substrate; sequentially depositing a silicon dioxide layer and a silicon nitride layer on the substrate; forming a patterned photoresist layer on the silicon nitride layer; using the patterned photoresist layer as a mask to etch the silicon nitride layer and the silicon dioxide layer with the substrate partly etched away to form a protrusion; removing the patterned photoresist layer to form an isolation layer; removing the silicon nitride and the silicon dioxide layer, sequentially depositing a dielectric layer and a polysilicon layer; and anisotropically etching the polysilicon layer to form nanowires on a region of the dielectric layer, which is around sidewalls of the protrusion.

20 Claims, 8 Drawing Sheets

NANOWIRE FABRICATION METHOD AND SEMICONDUCTOR ELEMENT USING NANOWIRE FABRICATED THEREBY

BACKGROUND OF THE INVENTION

1. Field of the Invention

The present invention relates to a nanowire fabrication method and a semiconductor element using a nanowire fabricated thereby, particularly to a method for fabricating a sidewall spacer nanowire in the frontend process and a semiconductor element using a nanowire fabricated thereby.

2. Description of the Related Art

The field-effect transistor (FET) using nanowire works at least four times faster than the traditional silicon transistor. Therefore, nanowire can be used to develop inexpensive high-efficiency element. Further, nanowire can reduce IC volume and favors their application in various portable electronic products, such as mobile phones and notebook computers. Besides, nanowire-based FET can be fabricated into high-sensitivity biochemical detectors via an ion-selectivity method or an enzyme-immobilization method. Therefore, nanowire application is a very promising technology.

Figure 1A:
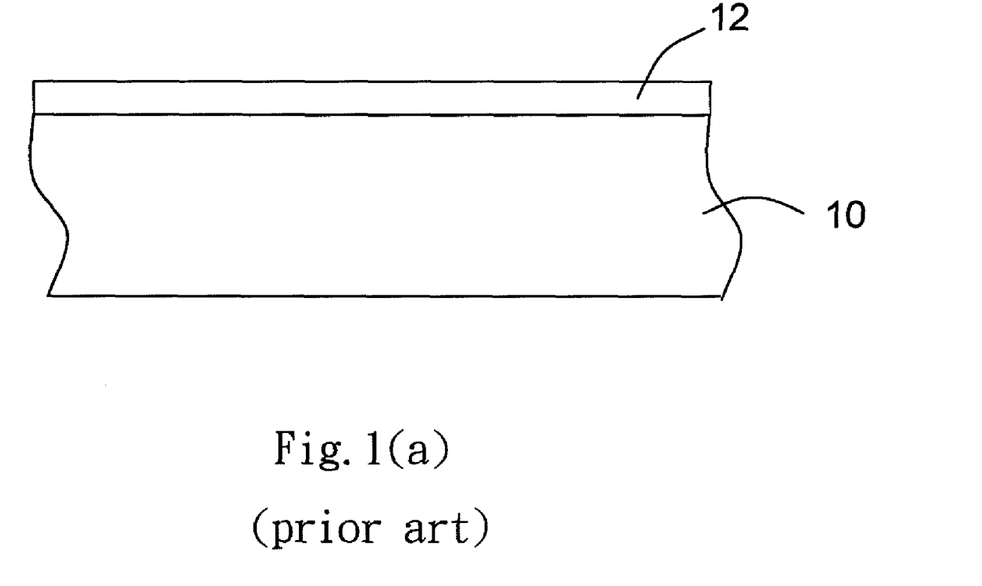
FIGS. 1(a)-1(d) are diagrams schematically showing the steps of the conventional nanowire fabrication process.
Figure 1B:
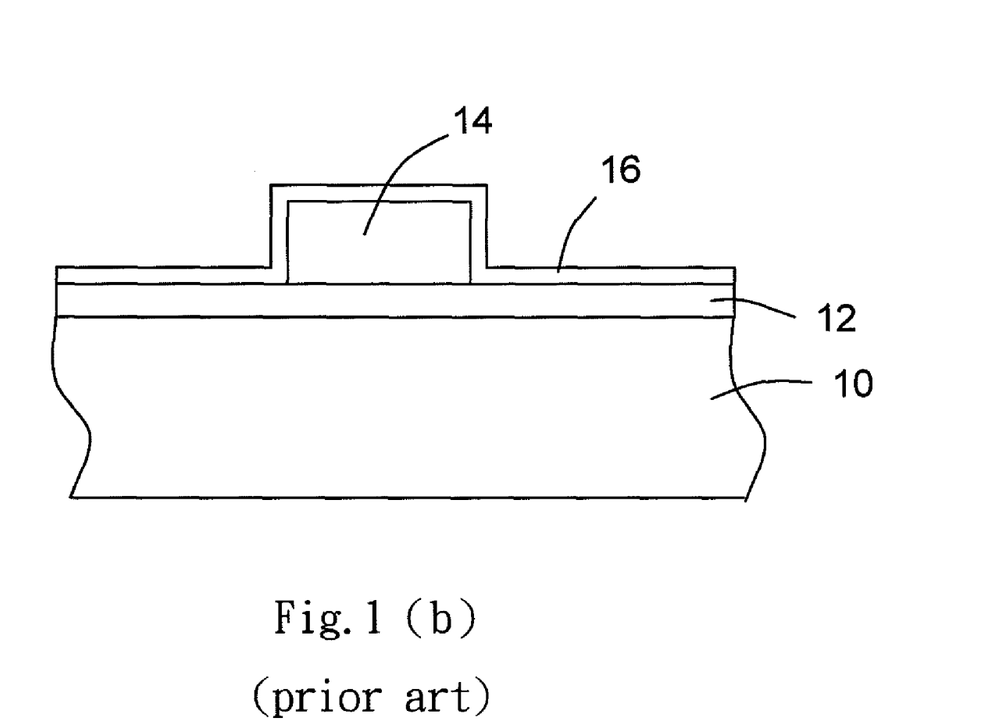
Figure 1C:
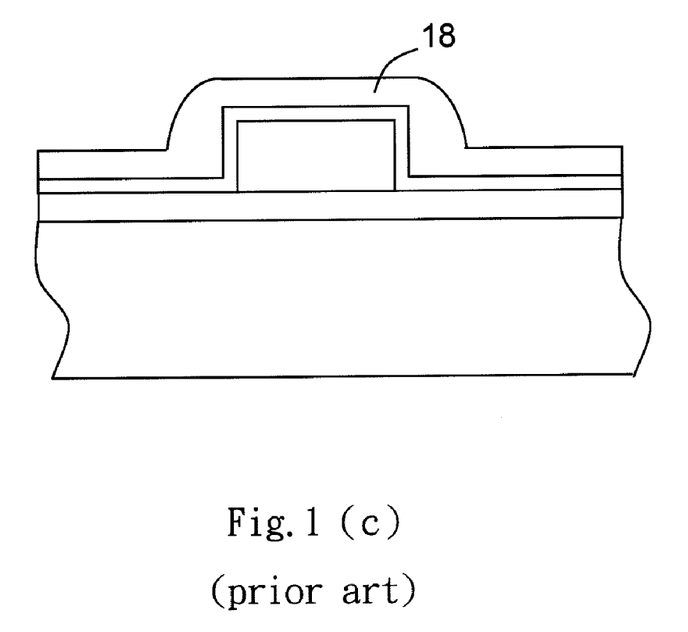
Figure 1D:
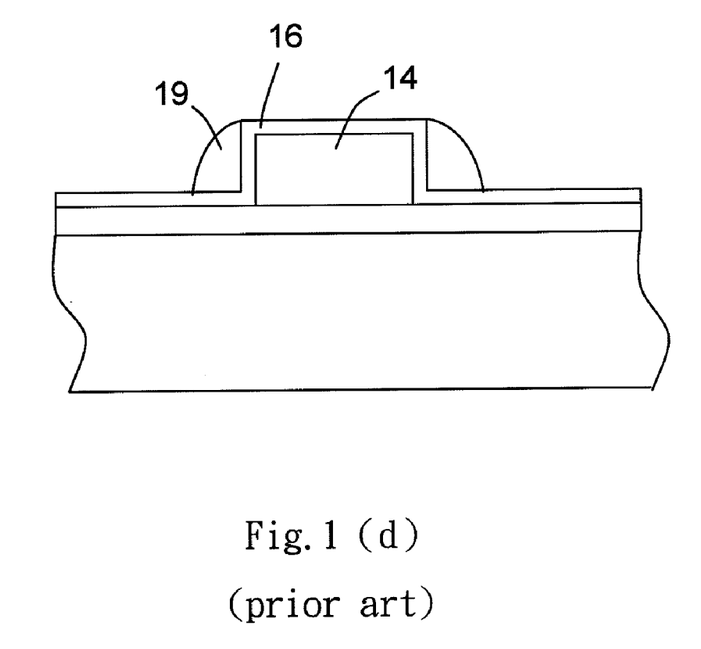

Refer to FIGS. 1(a)-1(d) diagrams schematically showing the steps of the conventional nanowire fabrication process. Firstly, provide a substrate 10, and form a thermal oxidation layer 12 on the substrate 10, as shown in FIG. 1(a). An insulating dielectric layer may be a substitute for the thermal oxidation layer 12. Next, sequentially form a virtual gate 14 and a virtual gate dielectric layer 16 on the thermal oxidation layer 12, as shown in FIG. 1(b). Next, deposit a polysilicon layer 18 on the virtual gate dielectric layer 16, as shown in FIG. 1(c). Then, etch the polysilicon layer 18 with a dry etching method to form a polysilicon nanowire 19 around the sidewall of the virtual gate 14, as shown in FIG. 1(d). However, the conventional technology needs an additional photomask to form the virtual gate. Further, the polysilicon nanowire can only be formed in the backend process of the conventional technology, i.e., formed on the circuit having been formed on the substrate. Therefore, the element may have problems in integrating with related circuits.

Accordingly, the present invention proposes a novel nanowire fabrication method and a semiconductor element using a nanowire fabricated thereby to overcome the above-mentioned problems.

SUMMARY OF THE INVENTION

The primary objective of the present invention is to provide a nanowire fabrication method and a semiconductor element using a nanowire fabricated thereby, wherein the method can fabricate nanowire in the frontend process and can perfectly integrate with the CMOS process.

Another objective of the present invention is to provide a nanowire fabrication method and a semiconductor element using a nanowire fabricated thereby, wherein the nanowire can integrate with CMOS elements to form an SOC (System-On-Chip).

A further objective of the present invention is to provide a nanowire fabrication method and a semiconductor element using a nanowire fabricated thereby, whereby the fabrication process is greatly simplified, and whereby the fabrication cost and fabrication risk is also effectively reduced.

To achieve the abovementioned objectives, the present invention proposes a nanowire fabrication method, which comprises following steps: providing a semiconductor substrate; sequentially depositing a silicon dioxide layer and a silicon nitride layer on the semiconductor substrate; forming a patterned photoresist layer on the silicon nitride layer; using the patterned photoresist layer as a mask to etch the silicon nitride layer and the silicon dioxide layer with the semiconductor substrate partly etched away to form a protrusion; removing the patterned photoresist layer and forming an isolation layer to cover the semiconductor substrate but reveal the silicon dioxide layer, the silicon nitride layer and a part of the protrusion; removing the silicon nitride and the silicon dioxide layer, sequentially depositing a dielectric layer and a polysilicon layer, wherein the dielectric layer covers the isolation layer and the protrusion outcropping from the isolation layer, and wherein the polysilicon layer is deposited on the dielectric layer; and anisotropically etching the polysilicon layer to form nanowires on the dielectric layer around the sidewalls of the protrusion.

The present invention also proposes a nanowire-based semiconductor element, which comprises a semiconductor substrate having a protrusion; an isolation layer formed on a region of the semiconductor substrate, which is on two sides of the protrusion, with a portion of the protrusion being revealed; a dielectric layer covering the isolation layer and the protrusion outcropping from the isolation layer; and at least one nanowire formed on a region of the dielectric layer, which is around the sidewalls of the protrusion.

Below, the embodiments are described in detail to make easily understood the objectives, technical contents, characteristics and accomplishments of the present invention.

DETAILED DESCRIPTION OF THE INVENTION

Figure 2:
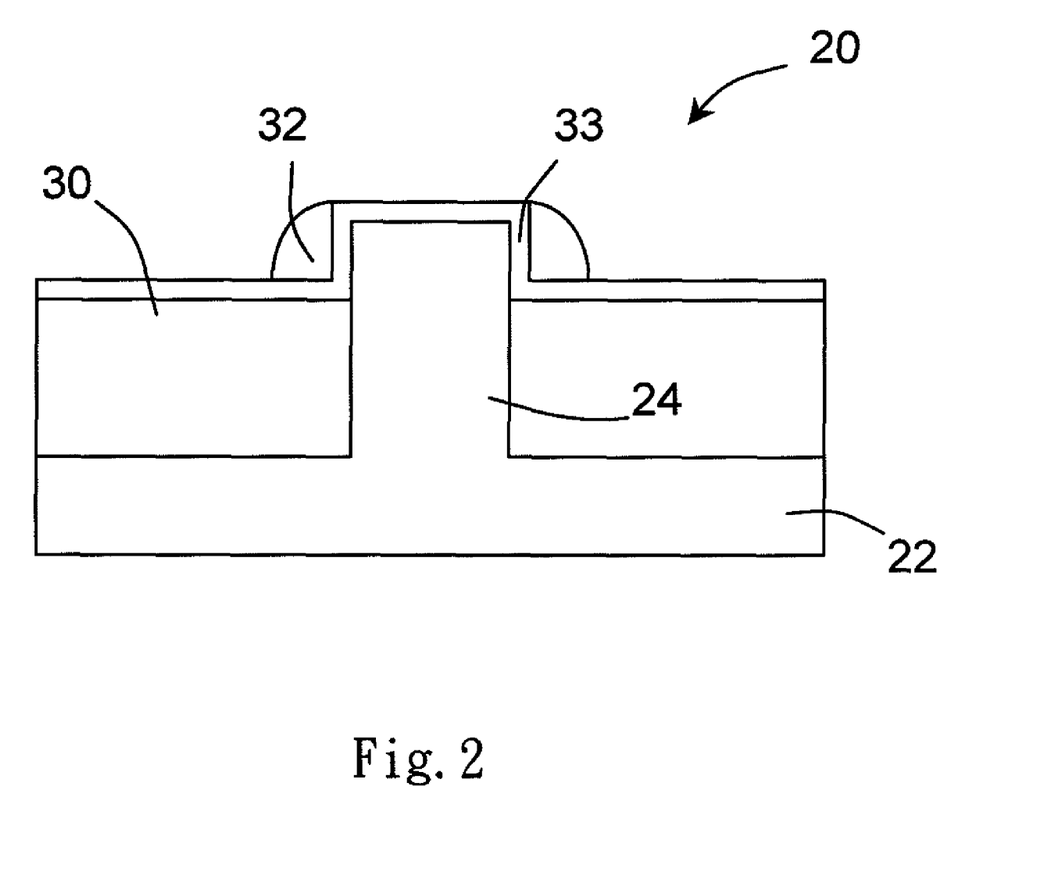
FIG. 2 is a sectional view schematically showing a nanowire-based semiconductor element according to one embodiment of the present invention.

Refer to FIG. 2 a sectional view schematically showing a nanowire-based semiconductor element according to one embodiment of the present invention. The semiconductor element 20 comprises a silicon substrate 22 having a protrusion 24 formed thereon; an isolation layer 30 formed on a region of the silicon substrate 22, which is on two sides of the protrusion 24; a dielectric layer 33 covering the isolation layer 30 and the protrusion 24 outcropping from the isolation layer 30; and two nanowires 32 formed on a region of the dielectric layer 33, which is around the sidewalls of the protrusion 33. In other words, the dielectric layer 33 separates the nanowires 32 from the isolation layer 30 and protrusion 24.

Below is described a process to fabricate the structure shown in FIG. 2. Refer to FIGS. 3(a)-3(i) sectional views schematically showing a nanowire fabrication method according to one embodiment of the present invention.

Figure 3:
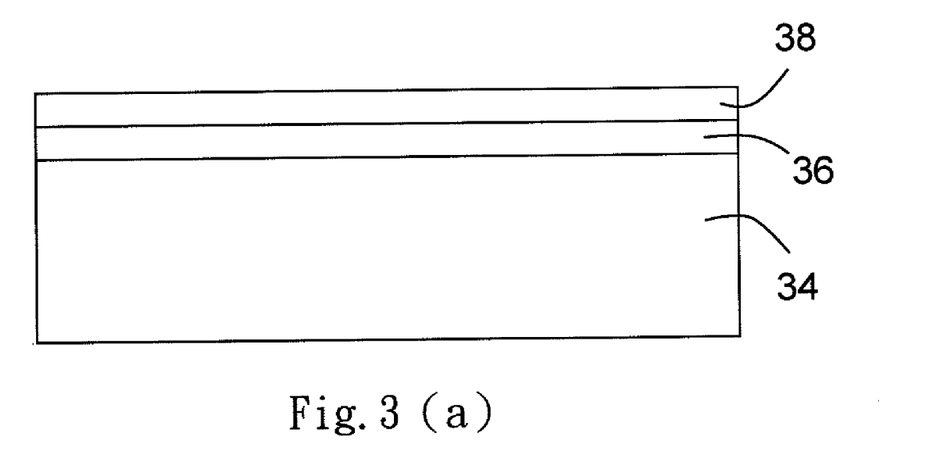
FIGS. 3(a)-3(i) are sectional views schematically showing a nanowire fabrication method according to one embodiment of the present invention.
Figure 3C:
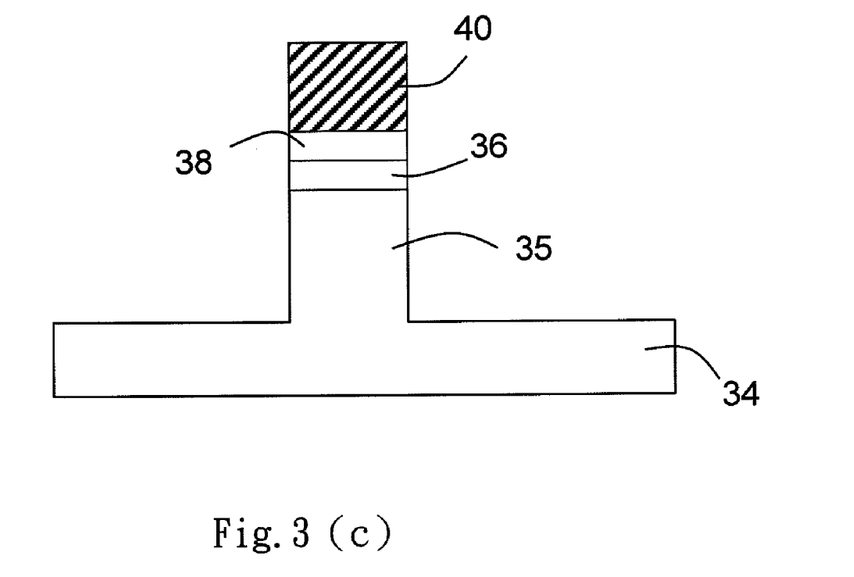

Firstly, provide a silicon substrate 34, and sequentially deposit a silicon dioxide 36 layer and a silicon nitride ($Si_3N_4$) layer 38 on the silicon substrate 34, as shown in FIG. 3(a). The silicon dioxide layer 36 has a thickness of 50-150 Å, and 100 Å is preferred. The silicon nitride layer 38 has a thickness of 500-1200 Å, and 900 Å is preferred. The deposition process can be undertaken in a tube furnace. Next, form a patterned photoresist layer 40 on the silicon nitride layer 38, as shown in FIG. 3(b). Next, use the patterned photoresist layer 40 as a mask to etch the silicon nitride layer 38 and the silicon dioxide layer 36 with the silicon substrate 34 partly etched away to form a protrusion 35, as shown in FIG. 3(c). The silicon substrate 34 is etched away by a thickness of 3000-4500 Å. In other words, the protrusion 35 has a height of 3000-4500 Å.

Figure 3D:
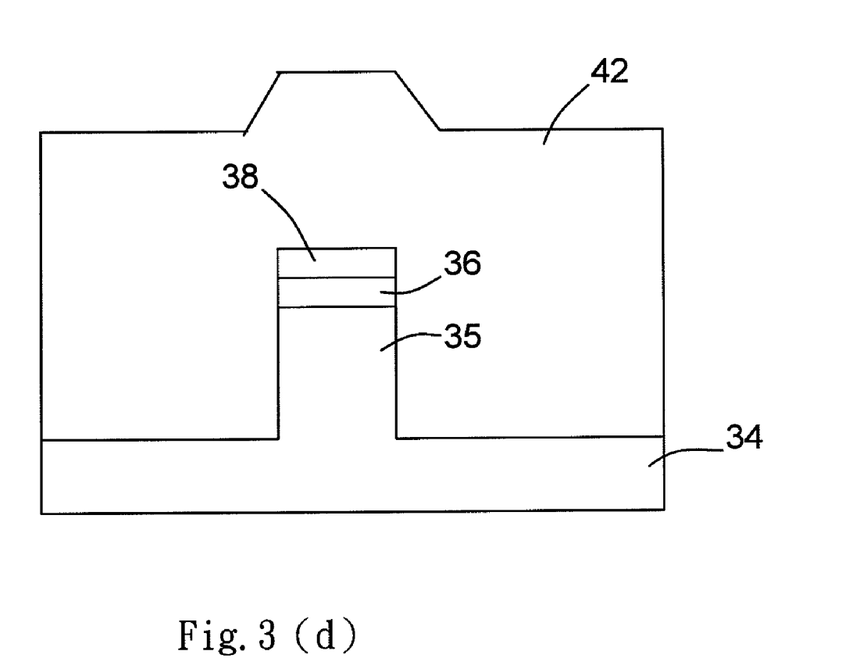

Next, remove the patterned photoresist layer 40 and deposit a TEOS (tetraethyl orthosilicate) layer 42 having a thickness of 6000-8000 Å to cover the silicon substrate 34, silicon dioxide layer 36, and silicon nitride layer 38, as shown in FIG. 3(d). The TEOS deposition process can be undertaken in a tube furnace.

Figure 3I:
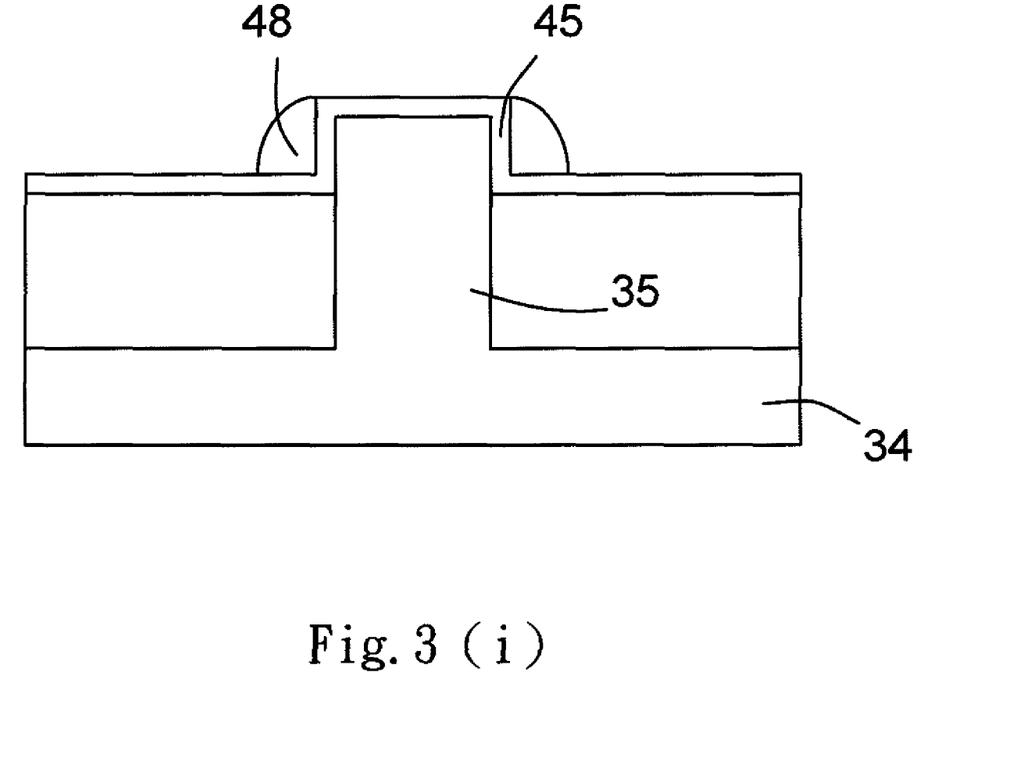

Next, perform chemical mechanical polishing on the TEOS layer 42 with the top surface of the silicon nitride layer 38 being the termination point of polishing until the top of the TEOS layer 42 is coplanar with the top of the silicon nitride layer 38, as shown in FIG. 3(e). Next, perform wet etching on the TEOS layer 42 to form a TEOS isolation layer 44 with the silicon nitride layer 38, silicon dioxide layer 36 and a part of the protrusion 35 being revealed, as shown in FIG. 3(f). Next, remove the silicon nitride layer 38 and silicon dioxide layer 36 to form a structure shown in FIG. 3(g). Next, deposit a dielectric layer 45 to cover the isolation layer 44 and the protrusion 35 outcropping from the isolation layer 44, and deposit a polysilicon layer 46 on the dielectric layer 45, as shown in FIG. 3(h). The dielectric layer 45 has a thickness of 20-200 Å, and the polysilicon layer 46 has a thickness of 800-1400 Å. The polysilicon deposition process can be undertaken in a tube furnace. Next, anisotropically etch the polysilicon layer 46 to form nanowires 48 on a region of the dielectric layer 45, which is around the sidewalls of the protrusion 35 outcropping from the isolation 44, as shown in FIG. 3(i). Thus is obtained a nanowire-based semiconductor element of the present invention.

The steps shown in FIGS. 3(a)-3(e) are similar to those of the STI (Shallow Trench Isolation) process. Therefore, the process of the present invention can perfectly integrate with the CMOS process and can be undertaken in the frontend of the overall manufacture process to form an SOC.

In conclusion, the present invention successfully uses the STI and self-alignment technologies to fabricate nanowires on a substrate. Compared with the conventional nanowire fabrication technology, the present invention not only greatly simplifies the fabrication process but also effectively reduces the fabrication cost and fabrication risk. Further, the present invention integrates nanowires with CMOS elements, whereby transistors and circuits are integrated on a substrate to form an SOC, and whereby the transistors and circuits are exempted from complicated packaging procedures. Thus is further reduced the cost. Furthermore, the nanowire-based transistors can be mass-fabricated into high-sensitivity biochemical detectors for detecting viruses or cancers via an ion-selectivity method or an enzyme-immobilization method.

The embodiments described above are only to exemplify the present invention but not to limit the scope of the present invention. Any equivalent modification or variation according to the spirit or characteristic of the present invention is to be also included within the scope of the present invention, which is based on the claims stated below.

What is claimed is:

1. A nanowire-based semiconductor element comprising a semiconductor substrate having a protrusion;
   an isolation layer formed on a region of said semiconductor substrate, which is on two sides of said protrusion, with said protrusion being partly revealed;
   a dielectric layer covering said isolation layer and a part of said protrusion, which outcrops from said isolation layer; and
   at least one nanowire formed on a region of said dielectric layer, which is around sidewalls of said protrusion.

2. The nanowire-based semiconductor element according to claim 1, wherein said nanowire is made of polysilicon.

3. The nanowire-based semiconductor element according to claim 1, wherein said protrusion has a height of 3000-4500 Å.

4. The nanowire-based semiconductor element according to claim 1, wherein said semiconductor substrate and said protrusion are made of silicon.

5. The nanowire-based semiconductor element according to claim 1, wherein said isolation layer is made of TEOS (tetraethyl orthosilicate).

6. The nanowire-based semiconductor element according to claim 1, wherein said dielectric layer has a thickness of 20-200 Å.

7. The nanowire-based semiconductor element according to claim 1, wherein said nanowire would integrate with CMOS elements to form an SOC (System-On-Chip).

8. A nanowire-based semiconductor element comprising:
   a semiconductor substrate having a protrusion;
   an isolation layer formed on a region of said semiconductor substrate, which is on two sides of said protrusion, with said protrusion being partly revealed;
   a dielectric layer covering said isolation layer and a part of said protrusion, which outcrops from said isolation layer; and
   two nanowires formed on a region of said dielectric layer, which is located on two sidewalls of said protrusion.

9. The nanowire-based semiconductor element according to claim 8, wherein said nanowires are made of polysilicon.

10. The nanowire-based semiconductor element according to claim 8, wherein said protrusion has a height of 3000-4500 Å.

11. The nanowire-based semiconductor element according to claim 8, wherein said semiconductor substrate and said protrusion are made of silicon.

12. The nanowire-based semiconductor element according to claim 8, wherein said isolation layer is made of TEOS (tetraethyl orthosilicate).

13. The nanowire-based semiconductor element according to claim 8, wherein said dielectric layer has a thickness of 20-200 Å.

14. The nanowire-based semiconductor element according to claim 8, wherein said nanowires would integrate with CMOS elements to form an SOC (System-On-Chip).

15. A nanowire-based semiconductor element comprising:
   a silicon substrate having a protrusion;
   an TEOS (tetraethyl orthosilicate) layer formed on a region of said silicon substrate, which is on two sides of said protrusion, with said protrusion being partly revealed;
   a dielectric layer covering said TEOS layer and a part of said protrusion, which outcrops from said TEOS layer; and
   at least one nanowire formed on a region of said dielectric layer, which is around sidewalls of said protrusion.

16. The nanowire-based semiconductor element according to claim 15, wherein said nanowire is made of polysilicon.

17. The nanowire-based semiconductor element according to claim 15, wherein said protrusion has a height of 3000-4500 Å.

18. The nanowire-based semiconductor element according to claim 15, wherein said protrusion is made of silicon.

19. The nanowire-based semiconductor element according to claim 15, wherein said dielectric layer has a thickness of 20-200 Å.

20. The nanowire-based semiconductor element according to claim 15, wherein said nanowire would integrate with CMOS elements to form an SOC (System-On-Chip).

* * * * *